United States Patent [19]

Mombrun et al.

[11] Patent Number: 4,969,958
[45] Date of Patent: Nov. 13, 1990

[54] PROCESS AND COMPOSITION FOR FORMING BLACK OXIDE LAYERS

[75] Inventors: Suzette L. Mombrun, Sunnyvale; Rudolf P. Sedlak, Palo Alto, both of Calif.

[73] Assignee: RD Chemical Company, Mountain View, Calif.

[21] Appl. No.: 331,262

[22] Filed: Mar. 30, 1989

[51] Int. Cl.$^5$ ............................................. C23C 22/00
[52] U.S. Cl. ........................................ 148/269; 427/96
[58] Field of Search ............... 148/269; 204/35.1, 56.1

[56] References Cited

U.S. PATENT DOCUMENTS 4,409,037  10/1983  Landau ................................. 148/251
4,512,818   4/1985  Valayil ................................. 148/251

OTHER PUBLICATIONS

K. Nargi, PC Fab, (Jun. 1985), 90-95.

Primary Examiner—Sam Silverberg
Attorney, Agent, or Firm—Irell & Manella

[57] ABSTRACT

Black, brown, and red oxide layers having high adhesion and peel strength are formed on printed circuit boards by adding a suitable amphipathic anionic surfactant to standard oxidizing solutions. The oxide layers thus formed result in multilayer circuit boards having reduced tendency to delaminate.

12 Claims, No Drawings

PROCESS AND COMPOSITION FOR FORMING BLACK OXIDE LAYERS

DESCRIPTION

1. Technical Field

This invention relates to the chemical processing of printed circuit boards for use in multilayer circuit boards. More specifically, the invention relates to the controlled oxidation of copper circuit paths to enhance interlayer adhesion.

2. Background of the Invention

Printed circuit boards have long been used in the fabrication of electronic components. Printed circuitry provides a support for discrete components, while providing most of the electrical interconnections between components. The circuitry pattern may be transferred to the board by photographic or lithographic techniques, thus permitting mass production without labor-intensive soldering. Circuit boards are generally manufactured from epoxy resin (typically containing reinforcing fiberglass fibers) clad on one or both sides with copper foil. The circuit pattern is applied to one or both sides marking the pathways with a resist, etching the non-masked copper from the board, and removing the resist.

Single and double sided boards are inherently limited with regard to the density of components they can support and the amount of current they can carry. Printed circuit paths cannot cross, thus requiring careful arrangement of components which may be suboptimum where components may interfere electromagnetically or generate excessive heat. The solution now used is the multilayer circuit board. Several single or double sided circuit boards are prepared, and are laminated together (separated by an appropriate dielectric, typically partially-cured resin) under pressure and heat to form an integral composite board having several layer of circuitry embedded within.

Unfortunately, multilayer boards are prone to delamination and separation. The smooth copper surface of a printed circuit board is not conducive to strong adhesion. It has been suggested that under the heat of the lamination process, amine hydrogen atoms within the resin can reduce oxides and hydroxides on the copper surface to form water, resulting in poor bonding and delamination (K. Nargi, *PC Fab* (June 1985) 90-95). The solution now used is to carefully oxidize the copper paths to form a black oxide, typically using caustic hydroxide/chlorite solutions at elevated temperatures. Modern solutions also include a phosphate buffer, which may, if the pH is lowered sufficiently, cause formation of a brown or red oxide layer, rather than black. Brown or red/brown oxide layers are reported to provide even higher bond strengths than traditional black oxide layers. Properly prepared, black, brown, and red oxide layers improve interlayer adhesion ("peel strength") and reduce delamination.

However, black oxide formation is a finicky and empirical process. Successful formation of an even, homogeneous layer requires almost surgically clean substrate surfaces. Brown and red oxide layers are even more sensitive to uniformity and cleanliness of the substrate copper, and can be quite troublesome to prepare. The process is sensitive to concentration, temperature, and reaction time. The process must be carefully watched by an experienced technician in order to insure that an even layer of effective thickness is formed. Too much oxide actually decreases adhesion and peel strength. Valayil et al, U.S. Pat. No. 4,512,818 suggested improving the oxidation bath by adding a small amount of a water-soluble polymer such as cellulose, polyvinyl alcohol, polyvinylpyrrolidone, sodium alginate, and the like.

DISCLOSURE OF THE INVENTION

We have now invented an improved process for forming black, brown, or red oxide in the fabrication of multilayer circuit boards. The oxide layers of the invention exhibit improved adhesion and peel strength, and result in multilayer boards which are more resistant to delamination. The process of the invention is also advantageous in that reaction time is accelerated. The oxide layers are formed more evenly, with reduced sensitivity to the cleanliness of the substrate and the reaction time and temperature of the bath. The process comprises forming an oxide layer on a masked circuit board using an oxidizing solution containing an effective amount of an amphipathic anionic surfactant.

Another aspect of the invention is a solution for forming an oxide, comprising an alkali hydroxide, and alkali chlorite, optionally a buffer compound, and an effective amount of amphipathic anionic surfactant.

MODES OF CARRYING OUT THE INVENTION

A. Definitions

The term "amphipathic anionic surfactant" refers to a surface active compound which is anionic in aqueous solution, which displays both hydrophilic regions and hydrophobic regions, and which has a molecular weight of about 180-750 g/mol. These surfactants can provide an actual reduction in surface tension. Amphipathic anionic surfactants within the scope of this invention must be stable to elevated temperatures (135-200° F.), stable under caustic conditions (e.g., 6% chlorite and 4% hydroxide), and must be soluble under process conditions. Presently preferred amphipathic anionic surfactants are di(alkylphenyl)oxide disulfonates having alkyl of at least C10 (for example Dow XD8390, Dowfax® 2A1 and 2A0, and Poly-Tergent® 3B2), linear alkylsulfonates having at least seven carbon atoms preferably having between 3 and 15 ethylene oxide subunits per molecule (for example Avanel® S70 and Avanel® S90), and ethoxylated nonylphenol phosphate esters (for example Gafac® RE-610). Dow XD8390, Dowfax® 2A1 and 2A0 are available commercially from Dow Chemical, Midland, Mich. Poly-Tergent® 3B2 is commercially available from Olin Chemicals, Stamford, Conn. Avanel® S70 and Avanel® S90 are commercially available from Mazer-PPG, Gurnee, Ill. Gafac® RE-610 is commercially available from GAF Chemicals Corp., Wayne, N.J. Surfactants useful in the present invention are be prepared by methods known in the art, or are obtained from commercial sources.

The term "effective amount" as used herein refers to the amount of surfactant necessary to improve oxide formation. The effective amount will vary depending upon the particular surfactant selected and the process conditions employed. The process of the invention is not adversely affected by high concentrations of surfactant, so that higher concentrations may be used if desired. Lower concentrations are preferred due to the expense of using excessive surfactant. In traditional use of surfactants to reduce surface tension, it is found that surface tension decreases logarithmically with increasing surfactant concentration. At the critical micellar concentration or "CMC", the surface tension does not decrease with increasing concentration. The CMC is generally on the order of 0.3 g/L (0.03%) or less for anionic surfactants. Surprisingly, the best effect in the present invention occurs using concentrations of surfactant which are several times higher than the CMC. In general, an effective amount of surfactant will range from about 0.05-10%, preferably from about 0.1-1%, and most preferably about 0.5%.

The terms "alkali metal chlorite" and "alkali metal hydroxide" refer to chlorite and hydroxide salts of lithium, sodium, potassium, and the like. The most commonly employed alkali chlorites and hydroxides are sodium chlorite and sodium hydroxide.

The term "oxide-forming amount" refers to the amount of alkali metal chlorite and alkali metal hydroxide which is capable of forming a black oxide layer on copper or copper alloy printed circuit boards when combined in aqueous solution at 135-200 ° F., or the amount of alkali metal chlorite, alkali metal hydroxide, and buffer which is capable of forming a brown or red oxide layer under similar conditions. The particular amount of compound employed will vary with the precise conditions and reagents used, but in general ranges from about 20-150 g/L for sodium chlorite, and about 5-40 g/L for sodium hydroxide.

B. General Method

The compositions of the invention may be provided as solutions, solution concentrates, or in solid form (e.g., powders, granulates, pellets, compressed tablets, and the like). The compositions may be provided as full-strength solutions, or as concentrated solutions or solids for reconstitution by dilution to working strength. Solutions are simply prepared by mixing the appropriate concentrations of components together, with heating if necessary. Concentrated solutions may by saturated or partially saturated solutions, or may be saturated solutions having undissolved solids. Powders may be prepared by mixing the dry chemicals together, or by evaporating the solvent from a solution mixture. Full-strength solutions and concentrated solutions are presently preferred for convenience.

In practice, an etched copper-clad board is stripped of resist, carefully cleaned (typically by treatment with an alkaline or acid cleaning solution. The board is then immersed in an oxidizing bath, usually containing 5-15% chlorite and 2-8% hydroxide, 0.05-10% suitable amphipathic anionic surfactant (preferably from about 0.1-1%, and most preferably about 0.5%), and optionally about 0.1-5% phosphate. The temperature is maintained at about 135° F. up to the boiling point of the bath formulation, typically at about 185-190° F. The blackening process is usually complete within 3-5 minutes. However, the process of the invention may be conducted for as little as about 1 minute, and for as long as 10 minutes, and still achieve acceptable results. Brown or red oxide layers are formed by including a sufficient amount of buffer, preferably phosphate, in the bath composition. In contrast, the processes of the prior art require careful attention, and generally do not provide acceptable oxide layers if the reaction time is more than about 30 seconds longer or shorter than the optimum period.

The adhesion and resistance to delamination may be tested by preparing multilayer circuit boards and counting the number of failures. However, it is customary in the art to evaluate oxide peel strength by applying a piece of ordinary cellulose adhesive tape (e.g., Scotch tape), peeling the tape off in one motion, and observing the tape for the presence of oxide particles. A poor oxide layer will generally leave an easily visible amount of oxide on the tape, and will frequently leave a solid black film. A good oxide layer will leave little or no oxide on the tape. Oxide layers formed with the process of the invention usually do not loose any visible amount of oxide, and frequently retain a portion of the tape adhesive.

C. Examples

The examples presented below are provided as a further guide to the practitioner of ordinary skill in the art, and are not to be construed as limiting the invention in any way.

EXAMPLE 1

Preparation of Oxide Layers (A) A copper clad epoxy board was etched using prior art techniques, as a control for comparison to the process of the invention.

A copper clad laminate of copper foil over epoxy (1.5"×3") was cleaved by immersion for 2 min at ambient temperature in an acidic preplate cleaner RD-58 Chemprep (available from RD Chemical Co., Mountain View, Calif.). The plate was then rinsed with water, and immersed in a prior art black oxide bath for 3 min at 195° F.

| Bath A: | Sodium chlorite | 61.5 g/L |
|---|---|---|
| | Sodium hydroxide | 42.4 g/L |
| | water qs | 1.0 L |

Following immersion, the plate was blown dry with $N_2$ and inspected. The resulting oxide coating was black and appeared relatively thick.

Adhesion was tested using adhesive tape. A strip of adhesive tape was pressed to the black oxide surface, and pulled off in a single motion. The presence of a brown to black film on the tape indicated poor adhesion.

(B) The procedure of part A was repeated, substituting the following bath formulation:

| Bath B: | Sodium chlorite | 61.5 g/L |
|---|---|---|
| | Sodium hydroxide | 42.4 g/L |
| | Avanel ® S90 | 5.0 g/L |
| | water qs | 1.0 L |

Avanel ® S90 is a linear alkyl polyether sulfonate within the scope of the invention (available from PPG Industries, Inc.), and was added as a 35% aqueous solution.

When the plate prepared using this bath formulation was tape-tested, no oxide particles were found adhering to the tape. This demonstrated superior adhesion.

(C) The procedure of part A was repeated, substituting the following bath formulation:

| Bath C: | Sodium chlorite | 61.5 g/L |
|---|---|---|
| | Sodium hydroxide | 42.4 g/L |
| | Dowfax ® 2A1 | 5.0 g/L |
| | water qs | 1.0 L |

Dowfax ® 2A1 is a diphenyl oxide disulfonate within the scope of the invention (available from Dow Chemical Co., Midland, Mich.), and was added as a 45% aqueous solution.

When the plate prepared using this bath formulation was tape-tested, no oxide particles were found adhering to the tape. This demonstrated superior adhesion.

(D) The procedure of part A was repeated, substituting the following bath formulation:

| Bath D: | Sodium chlorite | 20.5 g/L |
|---|---|---|
| | Sodium hydroxide | 42.4 g/L |
| | Gafac ® RE-610 | 3.0 g/L |
| | water qs | 1.0 L |

Gafac ® RE-610 is an aromatic phosphate ester surfactant within the scope of the invention (available from GAF Corp., New York), and was added neat.

When the plate prepared using this bath formulation was tape-tested, no oxide particles were found adhering to the tape. This demonstrated superior adhesion.

(E) The procedure of part A was repeated, substituting the following bath formulation:

| Bath E: | Sodium chlorite | 61.5 g/L |
|---|---|---|
| | Sodium hydroxide | 42.4 g/L |
| | sodium heptanoate | 5.0 g/L |
| | water qs | 1.0 L |

Sodium heptanoate is a linear carboxylic acid outside the scope of this invention. No significant oxide coating was formed.

(F) The procedure of part A was repeated, substituting the following bath formulation:

| Bath F: | Sodium chlorite | 61.5 g/L |
|---|---|---|
| | Sodium hydroxide | 42.4 g/L |
| | sodium heptanesulfonate | 3.0 g/L |
| | water qs | 1.0 L |

Sodium heptanesulfonate is a linear alkyl sulfonate within the scope of the invention (available from Aldrich Chemical Co., Milwaukee, Wis.), and was added as a 35% aqueous solution.

When the plate prepared using this bath formulation was tape-tested, no oxide particles were found adhering to the tape. This demonstrated superior adhesion.

(G) The procedure of part A was repeated, substituting the following bath formulation:

| Bath G: | sodium chlorite | 61.5 g/L |
|---|---|---|
| | sodium hydroxide | 42.4 g/L |
| | sodium pentanesulfonate | 5.0 g/L |
| | water qs | 1.0 L |

Sodium pentanesulfonate is a linear alkyl sulfonate outside the scope of the invention (available from Aldrich Chemical Co., Milwaukee, Wis.), and was added as a 35% aqueous solution.

When the plate prepared using this bath, oxide formation was inhibited.

(H) The procedure of part A was repeated, substituting the following bath formulation:

| Bath H: | Sodium chlorite | 120.0 g/L |
|---|---|---|
| | Sodium hydroxide | 17.0 g/L |
| | Phosphoric acid | 1.0 g/L |
| | Poly-Tergent ® 3B2 | 5.0 g/L |
| | water qs | 1.0 L |

This formulation illustrates a brown oxide forming bath.

When the plate prepared using this bath formulation was tape-tested, no oxide particles were found adhering to the tape. This demonstrated superior adhesion.

EXAMPLE 2

Reaction Rate (A) The reactions described in Example 1, parts A and B, were conducted simultaneously in side-by-side experiments. Oxide formation was observed during the treatment.

Oxide formation in bath A exhibited an apparent lag time, whereas oxide formation in bath B (Avanel ® S90) appeared to commence immediately upon immersion. Oxide formation appeared to proceed more rapidly in bath B. Upon simultaneous removal of the plates after 1–2 minutes, a visible difference in coating was apparent. The plate treated in bath B exhibited a blacker, heavier oxide coat.

(B) The reaction described in Example 1, part A was conducted simultaneously in side-by-side experiments using the control bath (Bath A) and the following bath (Bath I). Oxide formation was observed during the treatment.

| Bath I: | Sodium chlorite | 61.5 g/L |
|---|---|---|
| | Sodium hydroxide | 42.4 g/L |
| | Barlox ® 12 | 3.0 g/L |
| | water qs | 1.0 L |

Barlox ® 12 is an amine oxide surfactant (classified as non-ionic/cationic) outside the scope of the invention (available from Lonza Inc., Long Beach, Calif.), and was added as a 30% aqueous solution.

Oxide formation appeared to proceed more slowly in bath I than in bath A (control).

What is claimed is:

1. A composition for forming an oxide coating for multilayer circuit boards, which composition comprises an aqueous solution comprising:
   an oxide-forming amount of an alkali metal chlorite;
   an oxide-forming amount of an alkali metal hydroxide; and
   an effective amount of an amphipathic anionic surfactant which is anionic in aqueous solution, displays both hydrophilic regions and hydrophobic regions, has a molecular weight of about 180–750 g/mol, is stable to 200° F., and is stable under caustic conditions, wherein said amphipathic anionic surfactant is a di(alkylphenyl)oxide disulfonate having alkyl of at least C10, linear alkylsulfonate having at least seven carbon atoms, linear poly(ethylene oxide) sulfonate having between 3 and 15 ethylene oxide subunits per molecule, or an ethoxylated nonylphenol phosphate esters.

2. The composition of claim 1 wherein said surfactant is selected from the group consisting of Dow XD8390, Dowfax ® 2A1, Dowfax ® 2A0, Poly-Tergent ® 3B2, Avanel ® S70, Avanel ® S90, and Gafac ® RE-610.

3. The composition of claim 1 wherein said surfactant is present in a concentration of about 0.05% to about 10%.

4. The composition of claim 3 wherein said surfactant is present in a concentration of about 0.1% to about 5%.

5. The composition of claim 4 wherein said surfactant is present in a concentration of about 0.5%.

6. A composition suitable for reconstitution to make an oxide-forming bath for multilayer printed circuit boards, wherein said composition comprises:
   about 20-150 parts alkali metal chlorite;
   about 5-40 parts alkali metal hydroxide;
   about 0.5-100 parts amphipathic anionic surfactant, wherein said surfactant is anionic in aqueous solution, displays both hydrophilic regions and hydrophobic regions, has a molecular weight of about 180-750 g/mol, is stable to 200° F., and is stable under caustic conditions, wherein said amphipathic anionic surfactant is a di(alkylphenyl)oxide disulfonate having alkyl of at least C10, linear alkylsulfonate having at least seven carbon atoms, linear poly(ethylene oxide) sulfonate having between 3 and 15 ethylene oxide subunits per molecule, or an ethoxylated nonylphenol phosphate esters;
   about 0-50 parts phosphate buffer; and
   about 0-1000 parts water.

7. The composition of claim 6, wherein said surfactant is present in about 1-10 parts.

8. A process for preparing oxide coatings having high peel strength on copper or copper alloy printed circuit boards for multilayer circuit boards, which process comprises:
   contacting said circuit board with an oxidizing composition at a temperature between about 135° F. and the boiling point of said oxidizing composition for about 1 to about 10 minutes, wherein said oxidizing composition comprises an oxide-forming amount of an alkali metal chlorite, an oxide-forming amount of an alkali metal hydroxide, an effective amount of an amphipathic anionic surfactant which is anionic in aqueous solution, displays both hydrophilic regions and hydrophobic regions, has a molecular weight of about 180-750 g/mol, is stable to 200° F., and is stable under caustic conditions, and a quantity of water sufficient to substantially dissolve said chlorite, hydroxide and surfactant, wherein said amphipathic anionic surfactant is a di(alkylphenyl)oxide disulfonate having alkyl of at least C10, linear alkylsulfonate having at least seven carbon atoms, linear poly(ethylene oxide) sulfonate having between 3 and 15 ethylene oxide subunits per molecule, or an ethoxylated nonylphenol phosphate esters.

9. The process of claim 8 wherein said surfactant is selected from the group consisting of Dow XD8390, Dowfax ® 2A1, Dowfax ® 2A0, Poly-Tergent ® 3B2, Avanel ® S70, Avanel ® S90, and Gafac ® RE-610.

10. A process for preparing oxide coatings having high peel strength on copper or copper alloy printed circuit boards for multilayer circuit boards, which process comprises:
    contacting said circuit board with an oxidizing composition at a temperature between about 135° F. and the boiling point of said oxidizing composition for about 1 to about 10 minutes, wherein said oxidizing composition comprises about 20-150 parts alkali metal chlorite, about 5-40 parts alkali metal hydroxide, about 0.5-100 parts amphipathic anionic surfactant which is anionic in aqueous solution, displays both hydrophilic regions and hydrophobic regions, has a molecular weight of about 180-750 g/mol, is stable to 200° F., and is stable under caustic conditions, about 0-50 parts phosphate buffer, and about 1000 parts water, wherein said amphipathic anionic surfactant is a di(alkylphenyl)oxide disulfonate having alkyl of at least C10, linear alkylsulfonate having at least seven carbon atoms, linear poly(ethylene oxide) sulfonate having between 3 and 15 ethylene oxide subunits per molecule, or an ethoxylated nonylphenol phosphate esters.

11. The process of claim 10 wherein said surfactant is present in about 1-10 parts.

12. The process of claim 11 wherein said surfactant is selected from the group consisting of Dow XD8390, Dowfax ® 2A1, Dowfax ® 2A0, Poly-Tergent ® 3B2, Avanel ® S70, Avanel ® S90, and Gafac ® RE-610.

* * * * *